United States Patent [19]

Katsura

[11] Patent Number: 5,138,257
[45] Date of Patent: Aug. 11, 1992

[54] CIRCUIT FOR TESTING INTERNAL DATA BUS OF INTEGRATED CIRCUIT

[75] Inventor: Joji Katsura, Nishinomiya, Japan

[73] Assignee: Matsushita Electric Industrial Co., Ltd., Osaka, Japan

[21] Appl. No.: 624,851

[22] Filed: Dec. 10, 1990

[30] Foreign Application Priority Data

Dec. 8, 1989 [JP] Japan .................................. 1-319856

[51] Int. Cl.⁵ ........................ G01R 31/28; G06F 11/00
[52] U.S. Cl. .................................. 324/158 R; 324/537; 371/29.5
[58] Field of Search ............... 324/158 R, 73.1, 537, 324/538; 371/25.1, 29.5

[56] References Cited

U.S. PATENT DOCUMENTS

| | | | |
|---|---|---|---|
| 4,514,845 | 4/1985 | Starr | 371/29.5 |
| 4,622,669 | 11/1986 | Pri-Tal | 371/25.1 |
| 4,951,283 | 8/1990 | Mastrocola et al. | 371/29.5 |

FOREIGN PATENT DOCUMENTS

| | | | |
|---|---|---|---|
| 0014744 | 2/1981 | Japan | 371/29.5 |
| 0110160 | 9/1981 | Japan | 371/29.5 |
| 0091547 | 4/1989 | Japan | 371/29.5 |

*Primary Examiner*—Ernest F. Karlsen
*Attorney, Agent, or Firm*—Lowe, Price, LeBlanc & Becker

[57] ABSTRACT

An internal bus test circuit for testing an integrated circuit internal bus which interconnects a plurality of function modules of the integrated circuit, the test circuit including switches that are operable for isolating respective modules from the bus, a bus setting circuit enabling individual lines to the bus to be set to a desired logic level, and a by-pass bus with corresponding by-pass circuits, for a function module that is connected between the bus and external pads. The test circuit thereby enables the bus functions to be easily tested in real-time operation, independently of the respective conditions of the test modules that are connected to the bus.

6 Claims, 4 Drawing Sheets

FIG. 4

| TEST | | MODE | SWITCH CIRCUITS 15, 16 | SWITCH CIRCUITS 17, 18 | BY-PASS CIRCUITS | BUS DATA SETTING CIRCUIT |
|---|---|---|---|---|---|---|
| 1 | 2 | | | | | |
| 1 | 1 | BUS CONDITION MONITOR | ON | OFF | ON | OFF |
| ∅ | 1 | BUS LINE SHORT-CIRCUIT CHECK | OFF | OFF | OFF | ON |
| 1 | ∅ | BUS LINE OPEN-CIRCUIT CHECK | OFF | OFF | ON | ON |
| ∅ | ∅ | NORMAL | ON | ON | OFF | OFF |

CIRCUIT FOR TESTING INTERNAL DATA BUS OF INTEGRATED CIRCUIT

BACKGROUND OF THE INVENTION

1. Field of Application

The present invention relates to a test circuit to be built into a semiconductor integrated circuit having an internal bus, for use in testing the internal bus.

2. Prior Art Technology

In general, a semiconductor integrated circuit (referred to the following simply as an integrated circuit) of a type having one or more internal buses such as an address, data bus, etc, is configured as a number of function modules within the integrated circuit chip. These function modules are mutually interconnected by the internal buses, and a function module will in general be connected between an internal bus and external pads (i.e. which are external to the integrated circuit chip and which are connected to the external pins of the integrated circuit), for use in transferring data etc. between the bus and external circuits. Usually, testing of such an integrated circuit is executed by applying a test pattern to the external pins of the integrated circuit, and the operation of the integrated circuit chip as a whole and also the operation of each of the function modules is thereby checked. FIG. 1 shows an example of a prior art integrated circuit having one internal bus designated by numeral 4 and three function modules I, II and III which are mutually interconnected via the internal bus 4. The integrated circuit further includes respective test circuits 5, 6 and 7 for the function modules I, II and III, and also a test circuit 8 for the internal bus 4. The internal bus 4 consists of a set of parallel data lines for respective bits of an address or a data word (e.g. 16 lines in the case of 16 bits), and a corresponding set of external pads 10 are provided which are connected to the function module III. These external pads 10 can be used both during normal operation of the integrated circuit and also for test purposes. The internal bus test circuit 8 is provided with a dedicated set of external pads 9, i.e. which are used only when testing the internal bus 4.

The purpose of the internal bus test circuit 8 is to enable the respective bit values of the lines of the internal bus 4 to be monitored, or to set these bit values as required for the purpose of testing the bus. It is thereby possible to detect the presence of open-circuits or short-circuits in the internal bus 4, by methods which are well known in the art and so will not be described in detail herein.

However with such a prior art integrated circuit, if faults occur within a plurality of the function modules, or within a plurality of lines of the internal bus, then it may be extremely difficult to detect and locate the faults by using the external pads 9 and 10, i.e. by monitoring or applying test signals to the external pins that are connected to these pads. In particular, when a fault occurs on an internal bus which interconnects a number of function modules, it is difficult to distinguish between a fault within a function module and a fault within the bus itself. Moreover, although a dedicated test circuit such as the test circuit 8 may be provided for an internal bus, the test circuits of the function modules have priority in the test operations, i.e. the main test objectives are to check the operation of each of the function modules. If a dedicated test circuit is also provided for an internal bus (or a number of dedicated test circuits, in the case of a plurality of internal buses), then the overall chip area is accordingly increased and may become excessively large, and the overall configuration of the integrated circuit may become excessively complex. In addition, the coupling of such an additional test circuit to each internal bus will result in an increased level of bus transmission delay. Furthermore, faults may arise in the test circuits themselves.

With a prior art integrated circuit having a dedicated test circuit for an internal bus, as illustrated in FIG. 1, it is necessary to provide a set of dedicated external pads, for use only in bus testing. Hence, the total number of pins of the integrated circuit will be accordingly increased. Moreover, as stated above, the testing of the function modules usually takes priority over testing of an internal bus or internal buses. It will therefore generally be necessary to use a test method whereby the test data for the internal buses are temporarily held, so that it is difficult to directly test the internal bus by real-time operation.

SUMMARY OF THE INVENTION

It is an objective of the present invention to overcome the disadvantages of the prior art as set out above, by providing a test circuit for an internal bus of an integrated circuit whereby the test circuit can be of simple configuration and small in circuit scale, and whereby faults of the internal bus can be easily and directly detected.

To achieve the above objectives, the present invention provides an internal bus test circuit for a semiconductor integrated circuit having a plurality of function modules, an internal bus for interconnecting the function modules, and a set of external pads for connection to external pins of the semiconductor integrated circuit, with one of the function modules being disposed between the external pads and the internal bus, the internal bus test circuit comprising:

a plurality of switch means coupled to corresponding ones of the function modules, each of the switch means being operable for isolating from the internal bus at least a set of output lines of the corresponding function module;

bus data setting circuit means operable for selectively setting each of a plurality of lines constituting the internal bus to a high potential level and a low potential level;

a by-pass bus; and by-pass circuit means, operable for selectively establishing a condition in which the internal bus is connected to the external pads through the function module that is disposed between the internal bus and the external pads and a condition in which the internal bus is connected directly to the external pads through the by-pass bus with the function module being by-passed.

The present invention enables test modes to be established, for an integrated circuit having an internal bus and a test circuit according to the present invention, whereby when the integrated circuit is set in a test mode, the potential levels of the signal lines of the internal bus can be easily set to desired values, for example potentials corresponding to a "1" logic level or a "0" logic level. Checking for open-circuits or short-circuits between the respective lines of the internal bus can thereby be easily performed. In addition, the test circuit includes respective switches provided for each of the function modules that are mutually interconnected by the internal bus, which enable the outputs from the function modules to be isolated from the internal bus, and in that condition, arbitrary data values can be set on the respective lines of the internal bus, and the results can be monitored without being affected by the presence or absence of faults in any of the function modules. Moreover, if the internal bus is connected to corresponding external pads through a function module, the test circuit includes by-pass circuits and a by-pass bus whereby the internal bus can be connected directly to those external pads. Thus, the internal bus condition can be directly checked completely independently of the respective conditions of all of the function modules of the integrated circuit that are coupled to the bus.

BRIEF DESCRIPTION OF THE DRAWINGS

FIG. 4 is a table showing various operating modes which can be established with the embodiment of FIG. 3.

DESCRIPTION OF PREFERRED EMBODIMENTS

Figure 1:
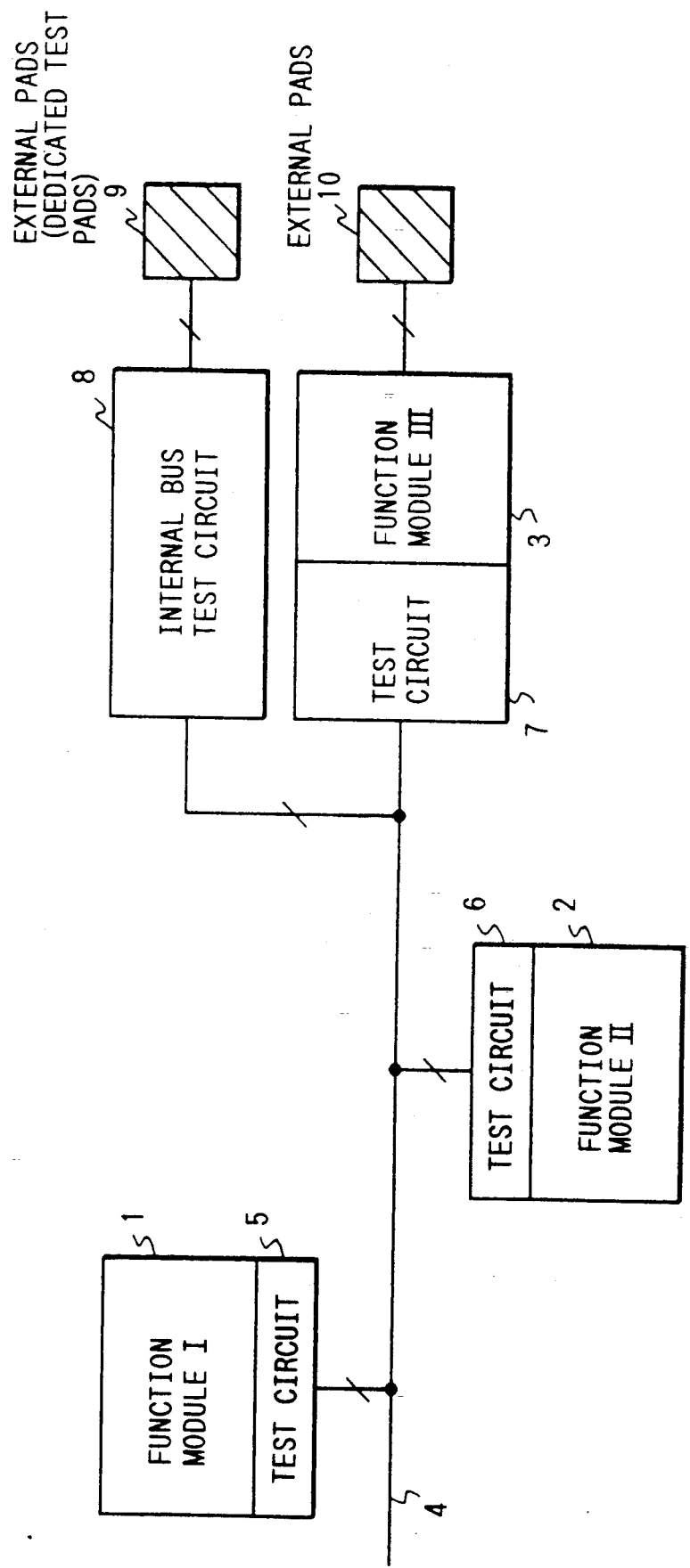
FIG. 1 is a block diagram of an example of a prior art test circuit configuration for an internal bus of an integrated circuit.
Figure 2:
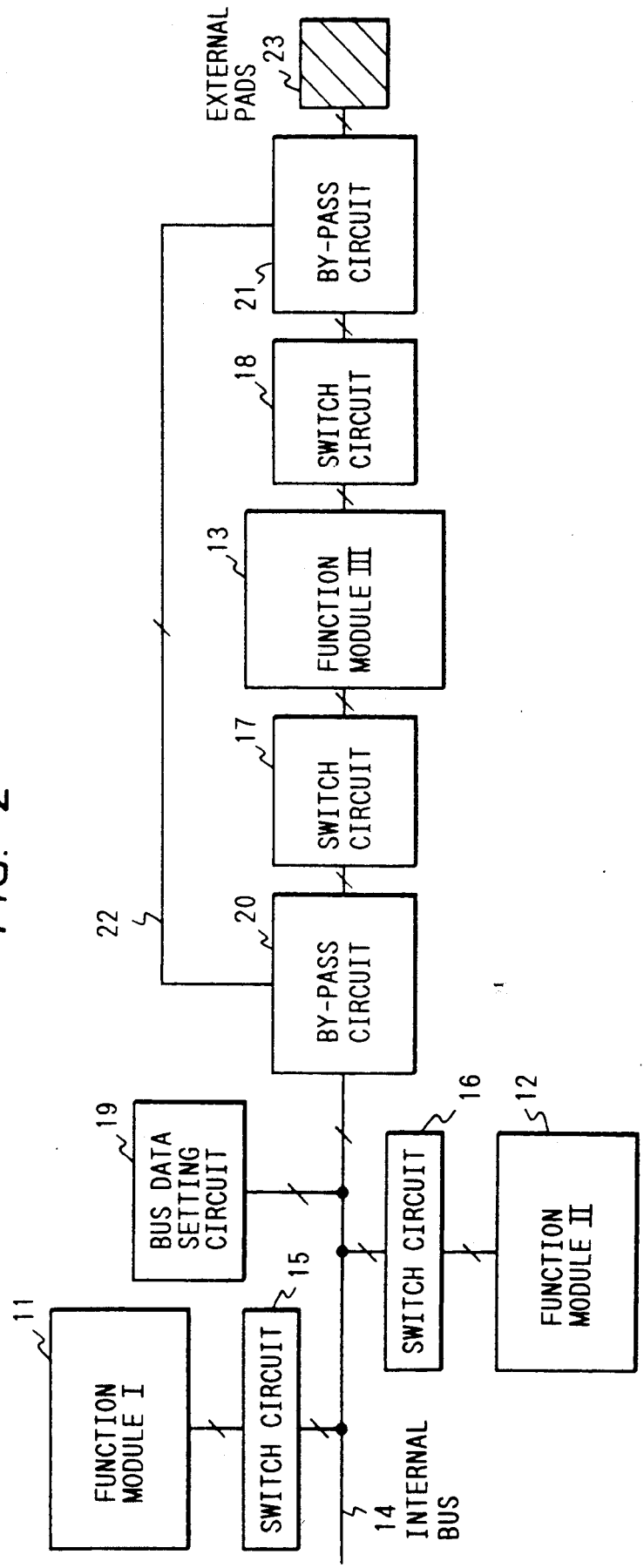
FIG. 2 is a block diagram of an integrated circuit incorporating a first embodiment of an internal bus test circuit according to the present invention.

FIG. 2 is a block diagram of an integrated circuit which includes a first embodiment of an internal bus test circuit according to the present invention. For simplicity of description the integrated circuit has a simple configuration, with only a single internal bus 14 which interconnects three function modules, respectively designated by numerals 11, 12 and 13. Switch circuits 15 and 16 are respectively positioned to be operable for isolating the function modules 11 and 12 from the internal bus 14. The function module 13 is disposed between the internal bus 14 and a set of external pads 23, i.e. at an interface position between the internal bus and circuits external to the integrated circuit. A switch circuit 17 is positioned to be operable for isolating the function module 13 from the internal bus 14, while a switch circuit 18 is positioned to be operable for isolating the function module 13 from external pads 23. By-pass circuits 20 and 21 are positioned between the switch circuit 17 and the internal bus 14 and between the switch circuit 18 and the external pads 23 respectively, and are operable for connecting the internal bus 14 to the external pads 23 (i.e. connecting respective lines of the internal bus 14 to corresponding pads of the external pads 23) through a by-pass bus 22 which is connected between these by-pass circuits 20, 21. It should be noted that term "by-pass bus" as used herein simply refers to a set of data lines (equal in number to the lines of the internal bus 14) for connecting the internal bus 14 to the external pads 23.

A bus data setting circuit 19 is connected to the internal bus 14, and is operable to set arbitrary bit values on each of the lines of the internal bus 14, for example enabling each line to be set to the "1" logic level potential or to the "0" logic level potential.

By setting each of the switch circuits 17 and 18 to the OFF (i.e. open) state and the by-pass circuits 20, 21 each to the ON (i.e. by-pass enabled) state, the condition of the internal bus 14 can be directly checked, using the external pads 23, irrespective of the condition of the function module 13. Each of the by-pass circuits 20, 21 is essentially a changeover switch circuit. It will be understood of course that each of the switch circuits 15, to 18 and by-pass circuits 20, 21 contains respective switch elements for each of the lines of the internal bus 14 (or for each of the output lines from the function module 13, in the case of the switch circuit 18).

The operation of this internal bus test circuit embodiment is as follows. To test the internal bus 14, each of the switch circuits 15 to 18 is set to the OFF state and the by-pass circuits 20, 21 are each set to the by-pass condition. To test the internal bus 14 for a shor-circuit between any pair of mutually adjacent lines of the bus, the bus data setting circuit 19 is operated to successively set each pair of mutually adjacent lines to two different potential levels, e.g. the "0" logic level and "1" logic level potentials. If there is a short circuit between a pair of lines, then there will be an increase in the operating power supply current level of the integrated circuit when such mutually different potentials are established between the lines, and that change in operating power supply current can be detected by various known methods. The same test, or a similar one, can be used to detect an open-circuit in any of the lines of the bus. For example, by monitoring the respective potentials of the lines (i.e. using the external pads 23), any line of the internal bus 14 which contains a short-circuit can be detected as a line for which no change in potential of the corresponding external pad occurs when the potential level of that line is altered (e.g. between the "0" logic level and "1" logic level) by operation of the bus data setting circuit 19. Thus, detection of both short-circuits and open-circuits in the internal bus 14 can be executed by monitoring the operating power supply current and also the respective potentials of the external pads 23 while varying the potentials that are applied to the lines of the internal bus 14 by the bus data setting circuit 19.

Thus with this embodiment of the present invention it is possible to directly test the internal bus 14 by real-time operation, using the external pads 23, irrespective of whether or not there is any fault in the function module 13 which is positioned between the internal bus 14 and the external pads 23. This is made possible by the by-pass circuits 20, 21 and by-pass bus 22 in conjunction with the switch circuits 17 and 18.

Moreover with the embodiment of FIG. 2, the internal bus can be tested with respect to any arbitrary one of the function modules (i.e. transfer of data into and/or out of the function module), by setting the corresponding switch circuits and the by-pass circuits appropriately. When the by-pass circuits 20, 21 are each set in the OFF (i.e. non-by-pass) condition, and the switch circuits 17, 18 to the ON state, normal operation of the function module 13 becomes possible, using the external pads 23. Thus, the external pads 23 can be used during a test mode for testing the internal bus 14 and also can be used in normal operation of the integrated circuit for data or address input and/or output purposes. It is therefore not necessary with the present invention to provide a dedicated set of external pads for an internal bus that must be tested, and hence the incorporation of an internal bus test circuit according to the present invention into an integrated circuit does not result in any increase in the total number of pins of the integrated circuit.

Figure 3:
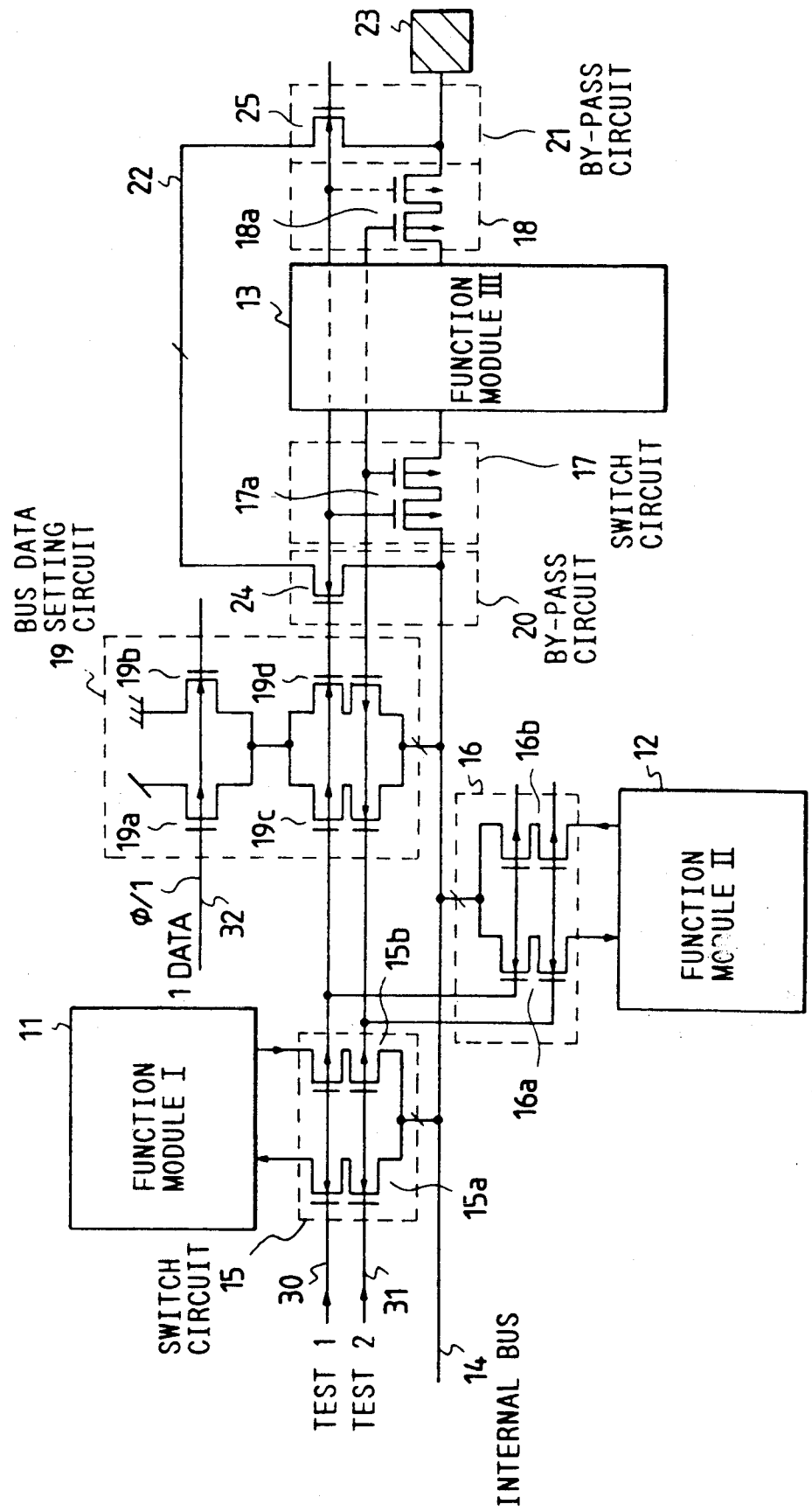
FIG. 3 is a block diagram of an integrated circuit incorporating a second embodiment of an internal bus test circuit according to the present invention.

A second embodiment of the present invention will now be described referring to FIG. 3, which is an example of a specific arrangement for the embodiment of FIG. 2, i.e. including specific configurations for each of the switch circuits 15 to 18 and the by-pass circuits 20, 21 of the embodiment of FIG. 2 together with signal lines for controlling these switch circuits and by-pass circuits. In FIG. 3, components corresponding to those of FIG. 2 are designated by corresponding reference numerals. In the second embodiment the operation of each of the switch circuits 15 to 18 and of the by-pass circuits 20, 21, as well as connection/disconnection of the bus data setting circuit 19 to the internal bus 14, is controlled by signals designated as TEST 1 and TEST 2 which are respectively applied to two control signal lines. Various methods of supplying the control signals TEST 1 and TEST 2 are possible, depending upon individual requirements, so that no specific arrangement for that will be described. Each circuit shown within the blocks 15 to 19 in FIG. 3 of course corresponds to a single line (i.e. single bit) of the internal bus 14, so that each block actually consists of a set of such circuits. As shown, the switch elements within the switch circuit 15 (corresponding to one line of the internal bus 14) consist of a series-connected pair of n-type FETs 15a and series-connected pair of p-type FETs 15b, with one FET of each pair being controlled by the test signal TEST 1 and the other FETs of the pairs 15a, 15b controlled by the test signal TEST 2. As indicated in the drawing, each FET pair 15a functions as a switch for an input line of the function module 11 (i.e. isolating that input line from the corresponding line of the internal bus 14 so long as the "0" logic level potential, i.e. ground potential, is applied to a gate electrode of at least one of the FETs of that pair 15a), while each FET pair 15b similarly functions as a switch for an output line of the function module 11. The switch elements within the switch circuit 16 for each line of the internal bus 14 similarly consist an FET pair 16a for isolation/connection to an input line of the function module 12 and an FET pair 16b for an output line of the function module 12.

The bus data setting circuit 19 contains (for each line of the internal bus 14) a p-type FET 19a having the drain electrode connected to the Vcc supply voltage (i.e. to the "1" potential level) and an N-type FET 19b having the drain electrode connected to the "0" logic level potential (i.e. to ground potential), with the source electrodes of the FETs 19a, 19b being connected in common. The gate electrodes of the FETs 19a, 19b are connected to a control line 32, to receive a control signal designated as DATA 0/1. The bus data setting circuit 19 further includes (for each line of the internal bus 14) a switch circuit for selectively coupling the common source connection point of the FETs 19a, 19b to the internal bus 14, that switch circuit being configured of a series-connected N-type FET and p-type FET pair 19c which are respectively controlled by the test signals TEST 1, TEST 2, and a series-connected p-type FET and N-type FET pair 19d which are respectively controlled by the test signals TEST 1, TEST 2. Thus, when both of the pairs of FETs 19c, 19d are set in the conducting state, i.e. the switch circuit of the bus data setting circuit 19 is set in the ON state, it becomes possible to set each of the lines of the internal bus 14 to the "1" logic level or "0" logic level potential, by varying the control signal DATA 0/1 of the corresponding control line 32 as required. The condition in which the switch circuit of the bus data setting circuit 19 is set in the ON state will be referred to in the following simply as the ON state of the bus data setting circuit 19.

The switch circuit 17 consists of a pair of p-type FETs 17a which are respectively controlled by the test signals TEST 1 and TEST 2, while the switch circuit 18 consists of a similarly controlled pair of p-type FETs 18a. The by-pass circuits 20, 21 are formed of respective n-type FETs 24, 25, each of which is controlled by the test signal TEST 1.

FIG. 4 is a table showing each of the four modes which can be established by the four possible logic level combinations of the test signals TEST 1 and TEST 2. When both of TEST 1 and TEST 2 are set to the "1" logic level, so that the switch circuits 15, 16 are each set in the ON state and the switch circuits 17, 18 are each set in the OFF state, with the by-pass circuits 20, 21 in the ON (i.e. by-pass enabled) state and the bus data setting circuit 19 in the ON state, a bus condition monitor mode is established, in which for example test data can be transferred to/from the function module 11 and function module 12 over the internal bus 14, with that data transfer being unaffected by the presence or absence of any faults in the function module 13, i.e. direct real-time monitoring of the internal bus 14 can be executed using the external pads 23

It would of course be easily possible to modify this embodiment to provide two additional modes, each of which differs from the bus condition monitor mode only in that in one of the additional modes the switch circuit 15 to be set in the OFF state when the switch circuit 16 is set in the ON state, while in the other additional mode the switch circuit 16 is set in the OFF state and switch circuit 15 in the ON state. That would enable testing of the operation of each of the function modules 11 and 12 to be executed by using the external pads 23. That is to say, if a fault is found when the aforementioned bus condition monitor mode is established, then for example if the fault is no longer detected when the switch 16 is set in the OFF state and the switch 15 in the ON state, that condition would indicate that the fault is located within the function module 12.

Referring again to the table of FIG. 4, when TEST 1 is set to the "0" logic level and TEST 2 to the "1" logic level, so that the switch circuits 15, 16 are each set in the OFF state and the switch circuits 17, 18 are also each set in the OFF state, with the by-pass circuits 20, 21 in the OFF (i.e. by-pass disenabled) state and the bus data setting circuit 19 in the ON state, a bus line short-circuit check mode is established. In that mode, as described hereinabove, the lines of the internal bus 14 can be set to respective arbitrary potential levels, by applying appropriate DATA 0/1 signals to the control lines 32 of the bus data setting circuit 19. Thus in that mode, a short-circuit between two adjacent lines of the internal bus 14 to which respectively different potential levels are being applied by the bus data setting circuit 19 can be detected as a change in a static operating power supply current level from the normal level.

Such short-circuit testing could also be done by using the by-pass circuits 20, 21, to apply external data.

If the test signal TEST 1 is set to the "1" logic level and TEST 2 to the "0" logic level, so that the switch circuits 15, 16 are each set in the OFF state and the switch circuits 17, 18 are also each set in the OFF state, with the by-pass circuits 20, 21 in the ON state and the bus data setting circuit 19 in the ON state, then a bus line open-circuit check mode is established as shown in the table of FIG. 4. In this mode, if there is an open-circuit in a line of the internal bus 14, then that condition can be detected by varying the respective potential levels that are applied to the lines of the internal bus 14 by the bus data setting circuit 19, and monitoring the resultant changes on the corresponding external pads 23. That is to say, if there is a short-circuit on a bus line and the short-circuit is located between the bus data setting circuit 19 and the function module 13, then there will be no change in potential of the corresponding one of the external pads 23 when the potential of that bus line is varied by operation of the bus data setting circuit 19. For effective checking in that mode it will of course be necessary to locate the bus data setting circuit 19 at a suitable position along the internal bus 14. The circuit diagram of in FIG. 3 is given only for illustration, and does not necessarily correspond to an actual circuit position of the bus data setting circuit 19 with respect to the internal bus 14.

It will be apparent that this mode enables checking of the internal bus 14 for short-circuits, irrespective of the respective conditions of the function modules 11, 12 and 13.

If each of the test signals TEST 1, TEST 2 is set to the "0" logic level, so that the switch circuits 15, 16, 17 and 18 are each set in the ON state, with the by-pass circuits 20, 21 and the bus data setting circuit 19 each in the OFF state, the normal operating mode is established, i.e. each of the function modules 11 to 13 of the integrated circuit can be operated in a normal manner, with the test circuit components having no effect upon that normal operation.

The embodiment of FIG. 3 is a simple example of how an internal bus test circuit according to the present invention can be applied to an integrated circuit. It will be apparent that such a test circuit could be extended to an integrated circuit having a plurality of internal buses and a larger number of function modules that are interconnected by these buses, simply by providing additional switch circuits for respective function modules and additional bus data setting circuits and by-pass circuits and by-pass buses for the internal buses, together with control lines for these.

Although in the above embodiment the output signals produced from the bus data setting circuit 19 are described as being the "1" and "0" logic level potentials, it would be equally possible to use other potentials which are intermediate between the "1" and "0" values, for these signals.

In addition, the modes that are set out in FIG. 4 are given only as examples, and the invention is not limited to these, since it would be possible to establish other modes by various other combinations of operation of the switch circuits, by-pass circuits, and bus data setting circuit.

As can be understood from the above, the present invention enables testing to be executed to enable detection of faults such as open-circuits or short-circuits of an internal bus of an integrated circuit, and that the testing can be easily performed, using a simple and small-scale circuit arrangement. Moreover, the condition of an internal bus can be directly checked during real-time operation of the integrated circuit by using external connecting pads that are utilized during normal operation of the integrated circuit (i.e. which are not dedicated test pads, so that incorporation of the test circuit does not result in an increase in the number of external pins of the integrated circuit), and that such real-time checking can be performed irrespective of the presence or absence of any faults in a function module that is located at an interface between the internal bus and the external pads. Thus, the invention enables faults in an integrated circuit to be rapidly detected, and moreover enables a fault to be rapidly located, by determining whether the fault is within an internal bus or within a function module. Thus the invention provides a significant improvement of the fault analysis capability of an integrated circuit to be achieved.

What is claimed is:

1. In an internal bus test circuit for a semiconductor integrated circuit having a plurality of function modules and an internal bus formed of a plurality of lines for interconnecting said function modules, the improvement comprising a circuit configuration for providing detectable changes to the bus to enable monitoring of internal bus errors, including:

a plurality of switch means (15, 16, 17, 18) coupled to corresponding ones of said function modules, each of said switch means being operable for isolating from said internal bus at least a set of output lines of the corresponding function module; and bus data setting circuit means (19) operable for selectively setting each of said plurality of lines constituting said internal bus to a high potential level and a low potential level;

thereby selectively setting said lines of the internal bus to high and low potential levels and producing detectable changes in at least one of voltage and current of said lines responsively to setting said lines to said high and low potentials for enabling detection of a fault in said internal bus.

2. In an internal bus test circuit for a semiconductor integrated circuit having a plurality of function modules, an internal bus formed of a plurality of lines for interconnecting said function modules, a set of external pads for connection to external pins of the integrated circuit, one of said function modules being disposed between said external pads and said internal bus, the improvement comprising:

a plurality of switch means (15, 16, 17, 18) coupled to corresponding ones of said function modules, each of said switch means being operable for isolating from said internal bus at least a set of output lines of the corresponding function module;

a by-pass bus (22); and by-pass circuit means (20, 21) operable for selectively establishing a condition in which said internal bus is connected to said external pads through said one of said function modules disposed between the internal bus and the external pads and a condition in which the internal bus is connected directly to the external pads through said by-pass bus and by-passing said one function module;

thereby selectively setting each of said external pads to a high potential level and a low potential level and producing detectable changes in power supply current or voltage of said integrated circuit responsively to setting said external pads to high and low potential levels for enabling detection of a fault in said internal bus.

3. An internal bus test circuit according to claim 2, comprising bus data setting circuit means (19) operable for selectively setting each of said plurality of lines forming said internal bus to a high potential level and a low potential level;

thereby enabling detection of a fault in said internal bus by producing, at said external pads, detectable changes in voltage or current of each said line of the internal bus occurring responsively to selectively setting said lines to high and low potential levels by said bus data setting circuit means.

4. An internal bus test circuit according to claim 2, wherein said function modules are connected in parallel to said internal bus and are interconnected thereby.

5. In a method for testing an internal bus for a semiconductor integrated circuit having: a plurality of function modules, an internal bus formed of a plurality of lines for interconnecting said function modules, a set of external pads for connection to external pins of the integrated circuit, one of said function modules being disposed between said external pads and said internal bus; a plurality of switch means (15, 16, 17, 18) coupled to corresponding ones of said function modules, each of said switch means being operable for isolating from said internal bus at least a set of output lines of the corresponding function module; a by-pass bus (22), and by-pass circuit means (20, 21), the improvement comprising the steps of:

for selectively establishing first and second conditions by operating said by-pass circuit means, including:
using said by-pass circuit means in said first condition for connecting said internal bus to said external pads through said one of said function modules disposed between the internal bus and the external pads and
using said by-pass means in said second condition for connecting said internal bus directly to the external pads through said by-pass bus and by-passing said one function module;

selectively setting each of said external pads to a high potential level and a low potential level, monitoring changes in at least one of power supply current and voltage provided to said integrated circuit occurring responsively to said step of selectively setting said external pads to high and low potential levels, thereby detecting a fault in said internal bus.

6. The method recited in claim 5, wherein said semiconductor integrated circuit further includes bus data setting circuit means (19), comprising the further steps of:

selectively setting each of said plurality of lines forming said internal bus to a high potential level and a low potential level using said bus data setting circuit means;

monitoring, at said external pads, changes in at least one of voltage and current of each said line of the internal bus occurring responsively to said step of selectively setting said lines to high and low potential levels, thereby detecting a fault in said internal bus.

* * * * *